United States Patent
Fischer et al.

(10) Patent No.: US 6,946,064 B2
(45) Date of Patent: Sep. 20, 2005

(54) SAMPLE MOUNT FOR PERFORMING SPUTTER-DEPOSITION IN A FOCUSED ION BEAM (FIB) TOOL

(75) Inventors: Lawrence S. Fischer, Poughkeepsie, NY (US); Steven B. Herschbein, Hopewell Junction, NY (US); Chad Rue, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 189 days.

(21) Appl. No.: 10/604,272

(22) Filed: Jul. 8, 2003

(65) Prior Publication Data

US 2005/0006231 A1 Jan. 13, 2005

(51) Int. Cl.[7] .............................. C23C 14/34; B23Q 3/18
(52) U.S. Cl. .......................... 204/298.15; 204/298.04; 269/58
(58) Field of Search ....................... 204/298.04, 298.15, 204/298.07; 269/58

(56) References Cited

U.S. PATENT DOCUMENTS

| | | | |
|---|---|---|---|
| 5,434,422 A | 7/1995 | Iwamoto et al. | 250/491.1 |
| 5,635,836 A | 6/1997 | Kirtley et al. | 324/262 |
| 5,922,179 A | 7/1999 | Mitro et al. | 204/298.04 |
| 6,407,850 B1 | 6/2002 | Rojo et al. | 359/290 |
| 6,783,596 B2 * | 8/2004 | Schaefer et al. | 118/503 |
| 2002/0005492 A1 | 1/2002 | Hashikawa et al. | 250/442.11 |
| 2002/0050565 A1 | 5/2002 | Tokuda et al. | 250/310 |

* cited by examiner

Primary Examiner—Steven Versteeg
(74) Attorney, Agent, or Firm—McGinn & Gibb, PLLC; Jay H. Anderson

(57) ABSTRACT

A method and structure for a sample processing apparatus that uses a vacuum enclosure is disclosed. A focused ion beam tool, sputter target, movable stage, and hinged mount are all included within the vacuum enclosure. The hinged mount includes a sample mounting portion, for holding a sample being processed in the vacuum enclosure, and a counterweight portion. The counterweight portion is connected to the sample mounting portion at an approximate right angle to the sample mounting portion. More specifically, one end of the sample mounting portion is connected to one end of the counterweight portion, such that the sample mounting portion and the counterweight portion form an approximate right angle. There is also an axis around which the mount rotates. The axis passes through the sample mounting portion and the counterweight portion at a location where the sample mounting portion and the counterweight portion connect to one another.

14 Claims, 2 Drawing Sheets

SAMPLE MOUNT FOR PERFORMING SPUTTER-DEPOSITION IN A FOCUSED ION BEAM (FIB) TOOL

BACKGROUND OF INVENTION

The present invention generally relates to a hinged sample mount for use in focused ion beam (FIB) tools that allows the user to position a sample horizontally (for routine sample preparation with the FIB) or vertically in order to use the FIB's ion beam to sputter-deposit any desired material from a sputter target onto the sample.

Conventionally, focused ion beam (FIB) tools are used to perform a single type of processing. FIB tools can be used during sample preparation, for example to remove material, etc. Alternatively, as shown in U.S. Pat. No. 6,407,850 (which is incorporated herein by reference) an FIB tool can be used to sputter away material from a sample. However, conventional devices cannot perform sample preparation and sputtering within a single vacuum container using the same focused ion beam tool. To the contrary, conventional systems require that the sample preparation and sputtering processes be performed using different tools (which necessitates breaking vacuum and exposing the sample to potentially corrosive airborne reagents). The invention described below provides a novel system whereby the preparation and sputtering can be performed within the same focused ion beam tool without breaking vacuum.

Focused Ion-Beam (FIB) tools remove material from a sample by mechanical sputtering with an energetic ion beam, typically gallium (Ga). The Ga ion beam can also be used to perform depositions by flooding the sample with vapors of metal-containing compounds. In this case, the Ga ion beam provides the energy necessary to decompose the metal-compound, leaving the metal on the surface of those areas exposed to the beam. The metal films deposited in this way incorporate many impurities and may exhibit significant electrical resistivity. Additionally, the user has no flexibility in what metal may be deposited. If the user needs to deposit a pure film or a specific metal over a FIB-processed site, the only option has been to remove the sample from the FIB and perform the deposition in a dedicated deposition tool, exposing potentially sensitive surface to atmospheric contaminants. The invention described below provides a novel system in which a sample can be processed with the FIB in the conventional way, and then repositioned in the FIB (without breaking vacuum) to allow a subsequent sputter deposition step of any desired material.

SUMMARY OF INVENTION

The following describes a sample processing apparatus within a vacuum enclosure. A focused ion beam tool, sputter target, movable stage, and hinged sample mount are all included within the vacuum enclosure. The hinged mount includes a sample mounting portion, for holding a sample being processed in the vacuum enclosure, and a counterweight portion. The counterweight portion is connected to the sample mounting portion at an approximate right angle to the sample mounting portion. More specifically, one end of the sample mounting portion is connected to one end of the counterweight portion, such that the sample mounting portion and the counterweight portion form an approximate right angle. There is also a hinge (axis, axel, pin, etc.) around which the mount rotates. The hinge passes through the sample mounting portion and the counterweight portion at a location where the sample mounting portion and the counterweight portion connect to one another.

When the hinged mount is in a first position, the sample mounting surface lies perpendicular to the ion beam, for conventional FIB processing. When the hinged mount is in the second position, the sample mounting surface is parallel to the ion beam and is in close proximity to a sputter target comprised of the material the user wishes to deposit onto the sample. The movable stage allows the user to position his/her sample beneath the ion beam for conventional FIB processing when the hinged mount is in the first position, and also allows the user to direct the ion beam onto the sputter target when the hinged mount is in the second position. In this way, the ion beam can be used to sputter-deposit material from the target onto the sample.

The orientation of the hinged mount is changed by tilting the FIB stage. Depending on the relative masses of the mounting surface and the counterweights, the mount can be adjusted to actuate (flip from one position to another) at a tilt angle appropriate to the FIB's tilting capability. After the mount flips to the new position, the FIB stage is lowered back to a tilt angle of zero. The counterweights ensure that the mount has enough stability to remain in the new position indefinitely, even when the FIB stage is untilted. However, the user can flip the mount back to the first orientation by tilting the stage in the opposite direction.

Thus, with the inventive apparatus, a sample can be prepared with the focused ion beam and sputtered from the sputter target within a single vacuum enclosure, without breaking vacuum.

BRIEF DESCRIPTION OF DRAWINGS

The invention will be better understood from the following detailed description of preferred embodiments with reference to the drawings, in which.

DETAILED DESCRIPTION

Figure 1:
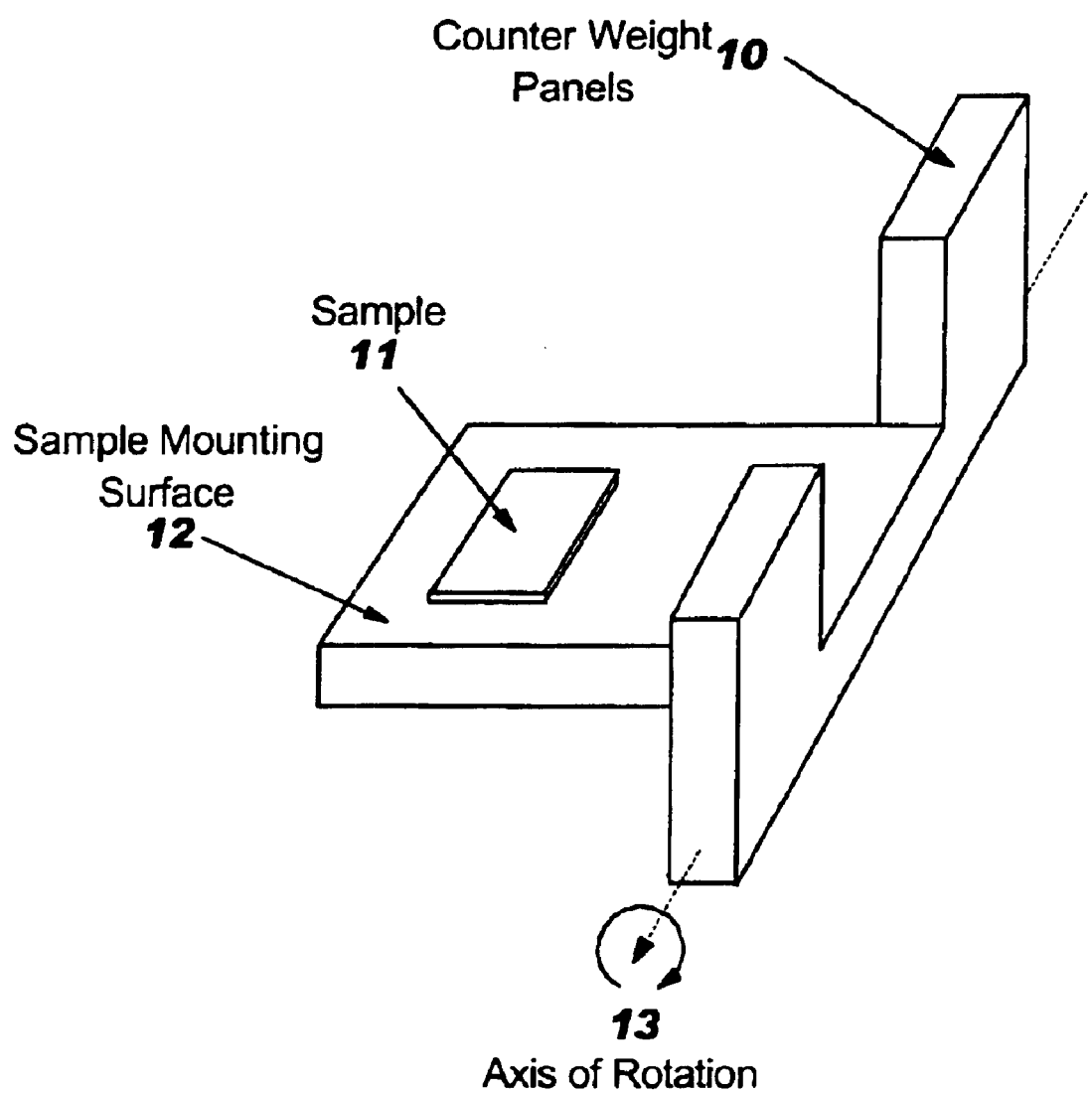
FIG. 1 is a perspective schematic diagram of one embodiment of the hinged sample mount.
Figure 2:
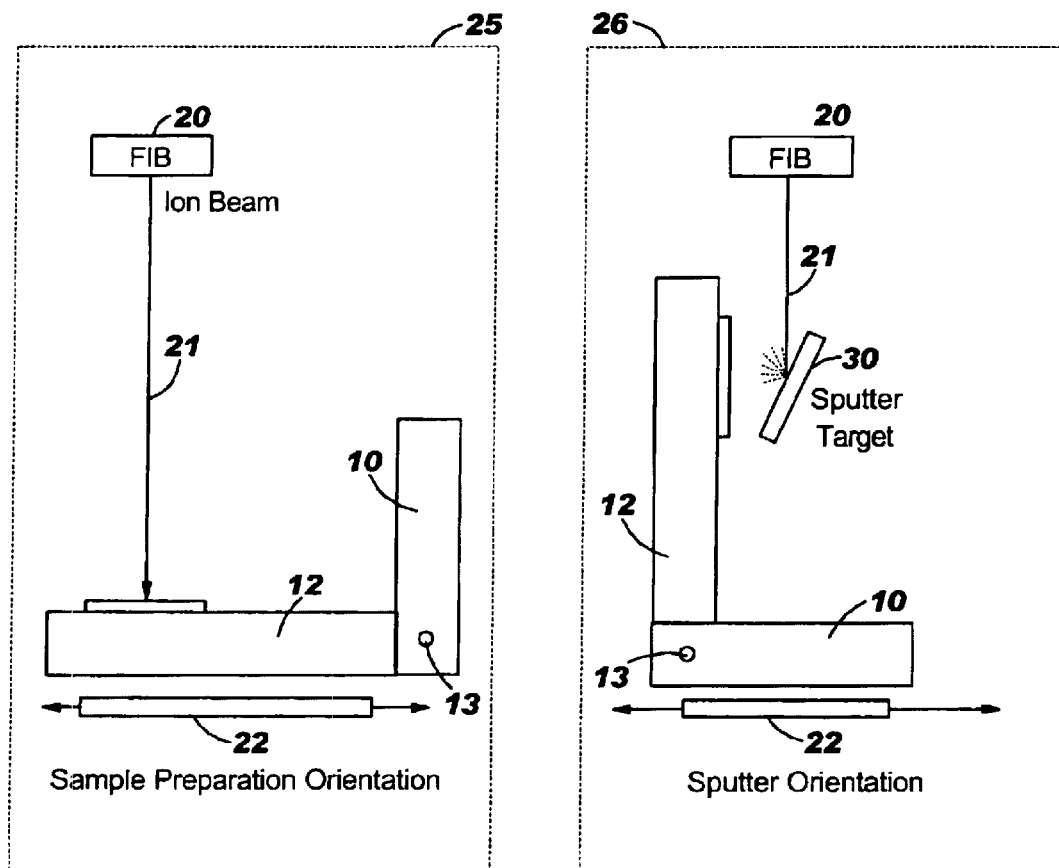
FIG. 2 is a side view of a vacuum container holding a focused ion beam tool and the inventive sample mount in the first and second orientation (for sample preparation)

FIGS. 1 and 2 illustrate a sample processing apparatus that uses a vacuum enclosure 25. A focused ion beam tool 20, sputter target 30, movable stage 22, and hinged mount are all included within the vacuum enclosure 25. The hinged mount includes a sample mounting surface 12 for holding a sample 11 being processed in the vacuum enclosure 25, and a counterweight portion 10. The counterweight portion 10 is connected to the sample mounting portion 12 at an approximate right angle to the sample mounting portion 12, as shown in the drawings. More specifically, one end of the sample mounting portion 12 is connected to one end of the counterweight portion 10, such that the sample mounting portion 12 and the counterweight portion 10 form an approximate right angle. The sample mounting portion 12 and the counterweight portion 10 can comprise separate members joined together, or the hinged mount can comprise a single piece of material that is formed to have a sample mounting portion 12 and a counterweight portion 10.

There is also a hinge (axis, axel, pin, etc.) 13 around which the mount rotates. The hinge 13 passes through the sample mounting portion 12 and the counterweight portion 10 at a location where the sample mounting portion 12 and the counterweight portion 10 connect to one another. When the hinged mount is in a "first position", the sample mounting surface 12 lies perpendicular to the ion beam 21 to allow surface preparation (e.g., material removal, etc.). When the hinged mount is in a "second position", the sample mounting surface 12 is parallel to the ion beam and in close proximity to the sputter target 30 to permit a sputter deposition process. The hinged mount is in a second position and the sample mounting surface is parallel to the ion beam and in sufficient proximity to the sputter target to permit material deposition on a sample positioned on the sample mounting portion.

When the mount is in the first position, the user positions the movable stage 22 to expose his/her sample 11 to the ion beam. When the hinged mount is in the second position, the sample will be in close proximity to the (fixed) sputter target, and the user positions the movable stage to expose the sputter target to the ion beam.

In one example, the apparatus flips from the first orientation to the second at a tilt angle of approximately 45 degrees, and flips from the second orientation back to the first at a tilt angle of approximately −58 degrees. In one embodiment, the FIB's stage only tilts in one direction, so de-activating the mount, ie flipping from the second orientation back to the first, requires the user to rotate the sample 180 degrees before tilting.

The inventive mount allows any material to be sputter deposited in the FIB, provided the user has a target 30 made of the material to be deposited. Additionally, the invention allows the sample 11 preparation and the sputter deposition to be done in the same tool 20, without having to break vacuum (and avoids exposing the sample 11 to the potentially corrosive atmosphere). This is especially useful when the presence of native oxides and other contaminants would damage the interface between the sample 11 and the sputtered film.

Thus, as shown above, a sample processing apparatus within a vacuum enclosure. A focused ion beam tool, sputter target, movable stage, and hinged sample mount are all included within the vacuum enclosure. The hinged mount includes a sample mounting portion, for holding a sample being processed in the vacuum enclosure, and a counterweight portion. The counterweight portion is connected to the sample mounting portion at an approximate right angle to the sample mounting portion. More specifically, one end of the sample mounting portion is connected to one end of the counterweight portion, such that the sample mounting portion and the counterweight portion form an approximate right angle. There is also a hinge (axis, axel, pin, etc.) around which the mount rotates. The hinge passes through the sample mounting portion and the counterweight portion at a location where the sample mounting portion and the counterweight portion connect to one another.

When the hinged mount is in a first position, the sample mounting surface lies perpendicular to the ion beam, for conventional FIB processing. When the hinged mount is in the second position, the sample mounting surface is parallel to the ion beam and is in close proximity to a sputter target comprised of the material the user wishes to deposit onto the sample. The movable stage allows the user to position his/her sample beneath the ion beam for conventional FIB processing when the hinged mount is in the first position, and also allows the user to direct the ion beam onto the sputter target when the hinged mount is in the second position. In this way, the ion beam can be used to sputter-deposit material from the target onto the sample.

The orientation of the hinged mount is changed by tilting the FIB stage. Depending on the relative masses of the mounting surface and the counterweights, the mount can be adjusted to actuate (flip from one position to another) at a tilt angle appropriate to the FIB's tilting capability. After the mount flips to the new position, the FIB stage is lowered back to a tilt angle of zero. The counterweights ensure that the mount has enough stability to remain in the new position indefinitely, even when the FIB stage is untilted. However, the user can flip the mount back to the first orientation by tilting the stage in the opposite direction.

Therefore, with the inventive apparatus, a sample can be prepared with the focused ion beam and sputtered from the sputter target within a single vacuum enclosure, without breaking vacuum.

While the invention has been described in terms of preferred embodiments, those skilled in the art will recognize that the invention can be practiced with modification within the spirit and scope of the appended claims.

What is claimed is:

1. A sample processing apparatus comprising:
   a vacuum enclosure;
   a focused ion beam tool within said vacuum enclosure;
   a sputter target within said vacuum enclosure; and
   a hinged mount within said vacuum enclosure,
   wherein said hinged mount comprises:
      a sample mounting portion adapted to hold a sample being processed in said vacuum enclosure;
      a counterweight portion connected to said sample mounting portion and being positioned at an approximate right angle to said sample mounting portion; and
      an axis around which said mount rotates, wherein said axis passes through said sample mounting portion and said counterweight portion at a location where said sample mounting portion and said counterweight portion connect to one another,
   wherein, when said hinged mount is in a first position, said sample mounting surface lies perpendicular to the ion beam, and
   wherein, when said hinged mount is in a second position, said sample mounting surface is parallel to the ion beam and in sufficient proximity to said sputter target to permit material deposition on a sample positioned on said sample mounting portion.

2. The apparatus in claim 1, wherein one end of said sample mounting portion is connected to one end of said counterweight portion, such that said sample mounting portion and said counterweight portion form an approximate right angle.

3. The apparatus in claim 1, further comprising a movable stage upon which said hinged mount is connected.

4. The apparatus in claim 3, wherein said movable stage allows said sample to be beneath said focused ion beam when said hinged mount is in said first position and also allows said sample to be in close proximity to said sputter target when said hinged mount is in said second position.

5. The apparatus in claim 3, wherein said hinged mount and said movable stage allow said sample to be placed directly next to said sputter target.

6. The apparatus in claim 1, wherein said counterweight portion maintains said hinged mount in said second position after said hinged mount is rotated to said second position.

7. A hinged mount for holding a sample within a vacuum enclosure, wherein said hinged mount comprises:
   a sample mounting portion adapted to hold a sample being processed in said vacuum enclosure;
   a counterweight portion connected to said sample mounting portion and being positioned at an approximate right angle to said sample mounting portion; and an axis around which said mount rotates, wherein said axis passes through said sample mounting portion and said counterweight portion at a location where said sample mounting portion and said counterweight portion connect to one another, wherein, when said hinged mount is in a first position, said sample mounting portion faces a focused ion beam tool located within said vacuum enclosure, and wherein, when said hinged mount is in a second position, said sample mounting portion faces a sputter target located within said vacuum enclosure.

8. The hinged mount in claim 7, wherein one end of said sample mounting portion is connected to one end of said counterweight portion, such that said sample mounting portion and said counterweight portion form an approximate right angle.

9. The hinged mount in claim 7, wherein said counterweight portion maintains said hinged mount in said second position after said hinged mount is rotated to said second position.

10. The hinged mount in claim 7, wherein said counterweight portion balances said sample mounting portion to allow said hinged mount to be more easily rotated between said first position and said second position.

11. An integrated circuit processing apparatus comprising:
- a vacuum enclosure;
- a focused ion beam tool within said vacuum enclosure;
- a sputter target within said vacuum enclosure;
- a movable stage within said vacuum enclosure; and
- a hinged mount within said vacuum enclosure on said stage, wherein said hinged mount comprises:

a sample mounting portion adapted to hold a sample being processed in said vacuum enclosure;

a counterweight portion connected to said sample mounting portion and being positioned at an approximate right angle to said sample mounting portion; and an axis around which said mount rotates, wherein said axis passes through said sample mounting portion and said counterweight portion at a location where said sample mounting portion and said counterweight portion connect to one another, wherein, when said hinged mount is in a first position, said sample mounting portion faces said focused ion beam tool, wherein, when said hinged mount is in a second position, said sample mounting portion faces said sputter target, and wherein said movable stage allows said sample to be beneath said focused ion beam tool when said hinged mount is in said first position and also allows said sample to be adjacent said sputter target when said hinged mount is in said second position.

12. The apparatus in claim 11, wherein one end of said sample mounting portion is connected to one end of said counterweight portion, such that said sample mounting portion and said counterweight portion form an approximate right angle.

13. The apparatus in claim 11, wherein said hinged mount and said movable stage allow said sample to be placed directly next to said sputter target.

14. The apparatus in claim 11, wherein said counterweight portion maintains said hinged mount in said second position after said hinged mount is rotated to said second position, and said counterweight portion balances said sample mounting portion to allow said hinged mount to be more easily rotated between said first position and said second position.

* * * * *